United States Patent
Galland et al.

(10) Patent No.: US 7,824,933 B2
(45) Date of Patent: Nov. 2, 2010

(54) METHOD OF DETERMINING N-WELL SCATTERING EFFECTS ON FETS

(75) Inventors: Micah Galland, Enosburg Falls, VT (US); Terence B. Hook, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 1190 days.

(21) Appl. No.: 10/906,826

(22) Filed: Mar. 8, 2005

(65) Prior Publication Data

US 2006/0205098 A1 Sep. 14, 2006

(51) Int. Cl.
*H01L 21/66* (2006.01)
*G01R 31/26* (2006.01)

(52) U.S. Cl. .......... 438/17; 257/E21.521; 257/E21.529; 716/2; 716/19; 438/14

(58) Field of Classification Search .............. 716/4, 716/16, 21, 2, 5, 19; 438/14, 16, 17; 324/765, 324/769; 257/E21.521, E21.529
See application file for complete search history.

(56) References Cited

U.S. PATENT DOCUMENTS

| | | | | |
|---|---|---|---|---|
| 5,432,714 A | * | 7/1995 | Chung et al. | 250/492.2 |
| 5,736,281 A | * | 4/1998 | Watson | 430/30 |
| 6,340,542 B1 | * | 1/2002 | Inoue et al. | 430/5 |
| 2003/0228741 A1 | * | 12/2003 | Schafbauer et al. | 438/531 |
| 2004/0034517 A1 | * | 2/2004 | Adler et al. | 703/14 |
| 2004/0157418 A1 | * | 8/2004 | Breitwisch et al. | 438/514 |
| 2005/0029602 A1 | * | 2/2005 | Sommer | 257/371 |
| 2006/0107243 A1 | * | 5/2006 | Chlipala et al. | 716/4 |
| 2006/0205098 A1 | * | 9/2006 | Galland et al. | 438/14 |
| 2007/0028195 A1 | * | 2/2007 | Chidambarrao et al. | 716/2 |

* cited by examiner

*Primary Examiner*—Matthew C Landau
*Assistant Examiner*—Latanya Crawford
(74) *Attorney, Agent, or Firm*—David Cain; Roberts Mlotkowski Safran & Cole, P.C.

(57) ABSTRACT

A process is provided for determining the effects of scattering from the edge of a resist during a doping process. Edges of a resist which has been patterned to create an n-well are simulated and individually stepped across a predetermined region in predetermined step sizes. The step sizes may vary from step to step after each step, the scattering effects due to the resist edge at its particular location is determined. A resist of virtually any shape may be divided into its component edges and each edge may be individually stepped during the process.

22 Claims, 8 Drawing Sheets

METHOD OF DETERMINING N-WELL SCATTERING EFFECTS ON FETS

FIELD OF THE INVENTION

The invention relates to doping semiconductor devices, and more particularly to pre-determining scattering effects when doping n-FETs and p-FETs.

BACKGROUND DESCRIPTION

When doping a semiconductor layer, such as when forming an n-well, an edge of a resist may scatter a portion of the dopant into exposed regions of the layer. Accordingly, dopant that impacts the edge of the resist may be deflected into the non-resist covered region. Such scattered dopant will typically be deposited a certain distance from the resist edge at a shallow depth relative to the unscattered dopant and is referred to as a scatter-doped region. Because the scatter-doped region lies at a shallow depth, the scattered dopanted region is positioned in a region apart from the main doped area and thus may alter the characteristics of a semiconductor device.

Because the scatter-doped area may alter the characteristics of a semiconductor device, it is advantageous to predict the location, depth and concentration of dopant in the scatter-doped region in order to better anticipate the semiconductor devices actual operating characteristics. Accordingly, once the characteristics of the scatter-doped region can be determined for a particular doping configuration, the effect of the scatter-doped region can be anticipated and the semiconductor design altered accordingly if necessary.

Scattering can occur from the edge of a resist during doping when doping particles strike scattering centers in the resist proximate to the edge of the resist. The doping particles may include either positive or negative ions, etc. Scattering centers of the resist typically include molecules which make up the resist. Accordingly, when the doping particles travel into the resist and strike a scattering center, the doping ion may be deflected by the scattering center. If the scattering center lies close to an edge of the resist, the scattered dopant particle may be deflected out of the resist into an adjacent region. The angle of deflection of the doping ions can be in virtually any direction from the scattering center; however, the doping ions will have a preferred range of scattering angles and generally will be distributed about a particular scattering angle with a Gaussian distribution.

In addition to having a scattering angle, doping ions will lose velocity when they are scattered by the scattering center, and the scattered velocity may be virtually any velocity lower than the original velocity of the scattered doping ion. However, there will be a statistically preferred scatter velocity with the other velocities generally distributed about the statistically preferred scatter velocity with a Gaussian distribution. Thus, the process of scattering doping ions off of scattering centers in an edge of a resist can be statistically known, and it becomes possible to determine the location of a scatter-doped region using various parameters such as doping ion type, doping ion velocity, resist type, resist edge location, etc. Consequently, it is advantageous to vary the location of a resist edge with increased flexibility.

In other words, it is known that the surface doping in n-FETs is affected by the proximity of nearby n-wells through ion scattering from mask edges, also known as the lateral straggle mechanism. There is also a complementary effect to p-FETs near n-FETs by ion scattering. Accordingly, to calculate an actual threshold voltage of such transistors, it is necessary to know how close a device is to nearby wells. Standard techniques for calculating such an effect typically involves shrinking and expanding n-well shapes to find FETs within a given distance from the n-well's edges. Device gates falling within this given distance are then intersected or overlapped with the expanded n-well shape and these intersected shapes are then bucketed based on distance from the n-well.

For example, for a U-shaped n-well, if the shape is expanded in all directions, the vertical components of the inside edges of the n-well will eventually merge at a point equidistant from both edges. If a FET gate exists within the U-shape, it will experience scattering effects from the n-well edges. While the typical shrink/expand method gave an estimate of a potential shift in threshold voltage, a more accurate method is desirable. Improved accuracy is needed because when multiple n-wells are close to the same gate, the typical shrink/expand technique often has difficulty accounting for a resulting increase in scattering.

Because the standard algorithms are shaped-based, U-shaped wells surrounding a device gate are considered an influence on the gate. Additionally, standard methods can intersect a merged shape with a gate to receive an area parameter that could be passed onto a simulation model. However, a merged or single shape approach does not take into account the fact that it is the n-well edges and not the n-well shape that defines scattering effects.

SUMMARY OF THE INVENTION

In a first aspect of the invention, a method of calculating scattering effects includes forming a shape having at least one substantially straight edge on a surface, and forming a first rectangle parallel to the at least one substantially straight edge and adjacent to the at least one straight edge. The method also includes calculating the effects of scattering from the first rectangle, and forming a second rectangle parallel to the first rectangle and adjacent to the first rectangle. Additionally, the method includes calculating the effects of scattering from the second rectangle.

In another aspect of the invention, a method of calculating scattering effects of an n-well includes dividing a shape having at least one substantially straight edge into at least one component edge corresponding to the at least one substantially straight edge, and forming a first rectangle from the at least one component edge. The method also includes intersecting the first rectangle with at least one FET, and attaching a first intersected area value to the at least one FET. Additionally, the method includes forming a second rectangle parallel to the first rectangle and adjacent to the first rectangle, and attaching a second intersected area value to the at least one FET.

In another aspect of the invention, a method of calculating scattering effects of an n-well includes stepping a straight edge of a shape across a surface towards either an n-FET or a p-FET, wherein stepping the straight edge comprises forming a first rectangle and a series of successive rectangles, wherein the first rectangle is formed adjacent and parallel to the straight edge and each successive rectangle is formed adjacent and parallel to a preceding rectangle.

DETAILED DESCRIPTION OF EMBODIMENTS OF THE INVENTION

The invention provides a more accurate determination of the location of a scatter-doped region in a layer of a semiconductor. Accordingly, the invention allows the effects of a scatter-doped region on the performance of the semiconductor device to be more accurately determined, and thus, improves the design and/or manufacturing process. The invention achieves these improvements by allowing a designer to simulate individually stepping one or more edges of the resist in predetermined incremental steps while calculating a location and density of a scatter-doped region caused by the edge at each incremental step. In other words, the invention is an edge-based technique which allows each individual edge to assert itself upon each affected device independent of the well's (or other device's) edges. The method works with any shape having at least one straight edge, including, for example, a square, rectangle, triangle, parallelogram, trapezoid, "L", and a "U" etc. Accordingly, a more accurate representation of n-well scattering effects are rendered.

For n-well doping, an opening in a resist is made where the opening allows dopant to pass into an underlying layer. Consequently, the edges of the resist coincide with the edges of the n-well. Scattering effects which occur during the doping process are due to the location of the resist edge or may be said to be due to the location of the n-well edge since the edge of the n-well corresponds to and is formed by the edge of the resist.

Figure 1:
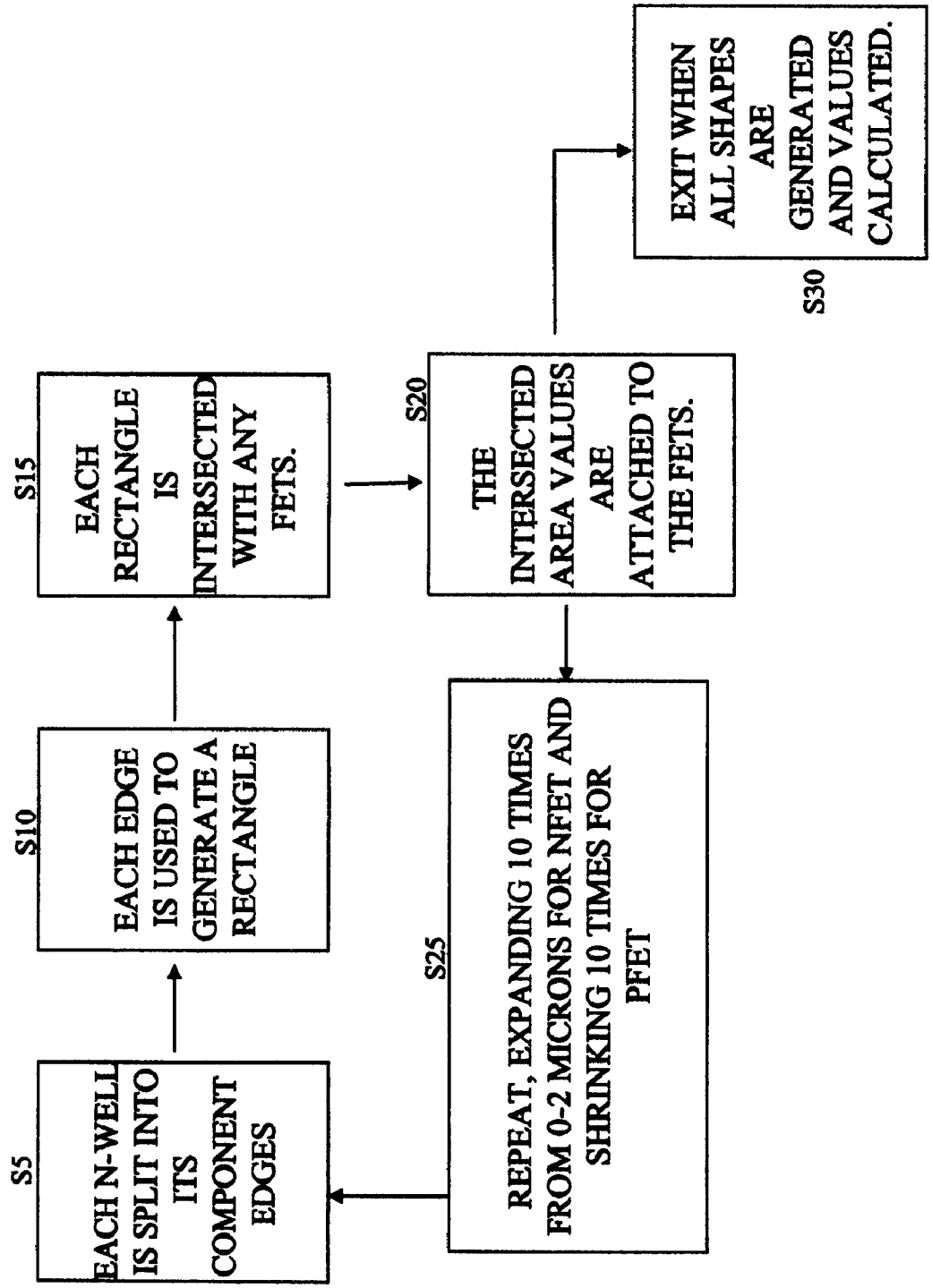
FIG. 1 illustrates a flow diagram for individually varying the location of resist edges in accordance with the invention.

Referring to FIG. 1, a flow chart of the stepping process is shown. The stepping process begins where an opening in a resist or an n-well is divided into its component edges or segments (S5). For example, the opening in a resist typically includes straight lines which meet at a vertex, typically at a 45° or 90° angle. A segment may consist of the straight portion of the resist opening between two vertices. It should be noted that there is no need to divide a straight line into more than one segment. Additionally, relatively short segments may be too small to have an affect on the scattering process, and thus do not need to be included in the calculation of scattering effects. However, a segment of any length may be included in the calculation.

Each component edge or segment which will be stepped, is used as a basis to generate a rectangle which is adjacent and parallel to the component edge (S10). A generated rectangle may be of any length or width, as determined by step parameters. For example, the width of the rectangle may be determined by the width of the distance over which the calculation will be performed by the number of steps. However, the width of the rectangle may be determined by any method appropriate for specifying rectangle widths. Additionally, the width of the rectangles of a series of steps for a particular edge may be equal to one another, or vary from one another. Where the rectangle widths vary from one another, the widths may vary in a uniform or non-uniform amount. The lengths of the rectangles in a series of steps may be constant or may vary in a manner similar to the width.

Each rectangle is then stepped along to intersect or overlap any components of the semiconductor device such as a gate of a FET, or simply a FET, in the stepping path (S15). Where there are multiple FETs, the series of rectangles may step over each FET in turn or simultaneously, depending on the FETs' positions relative to the direction of the rectangle steps. Additionally, the FETs may be oriented in any direction relative to the rectangles. For each rectangle which overlaps a FET, the area of the overlap is recorded. Where a rectangle overlaps multiple FETs, the area of overlap is recorded for each separate FET based on FET location and properties.

After the intersection of a FET or other device, the intersected area values are attached to the device (S20). Thus, each device which is overlapped has the data value of the overlap linked to it. This is done for each overlapped device for each rectangle which intersected it. Accordingly, each device may have multiple overlap values from a series of rectangles following a single stepping path from an edge, or may have multiple values from multiple rectangles where the device lies in the stepping path of more than one edge. Additionally, a device may have only one value associated with it where only one rectangle from a series of rectangles of a stepping path intersects it. In some instances the multiple values may be added together to determine a cumulative affect.

The process is repeated a predetermined number of times, one for each edge being stepped (S25). For example, where the opening in the resist is adjacent to an n-FET and a p-FET, a resist edge is typically stepped outward 10 times across a section 2 microns wide toward the n-FET. Additionally, the resist may be stepped inward 10 times across a distance of 2 microns towards the p-FET. Accordingly, the resist edges may be stepped towards either an n-FET or a p-FET, or other device on the layer.

Finally, when all edges of the shapes that are to be stepped have been generated and the scattering effects therefrom calculated, the process ends (S30). The number of steps may be an arbitrary number chosen as the best compromise between accuracy and calculation speed. Accordingly, the number of steps may range from 1 to virtually any number.

In sum, a method for determining n-well scattering effects on FETs includes growing each edge of an n-well inward and outward independently of other edges of the n-well and determining where each edge intersects a gate. The method also includes summing the areas formed by the intersections and applying the summed area to an FET device parameter. The method may also be applied to p-wells.

Figure 2:
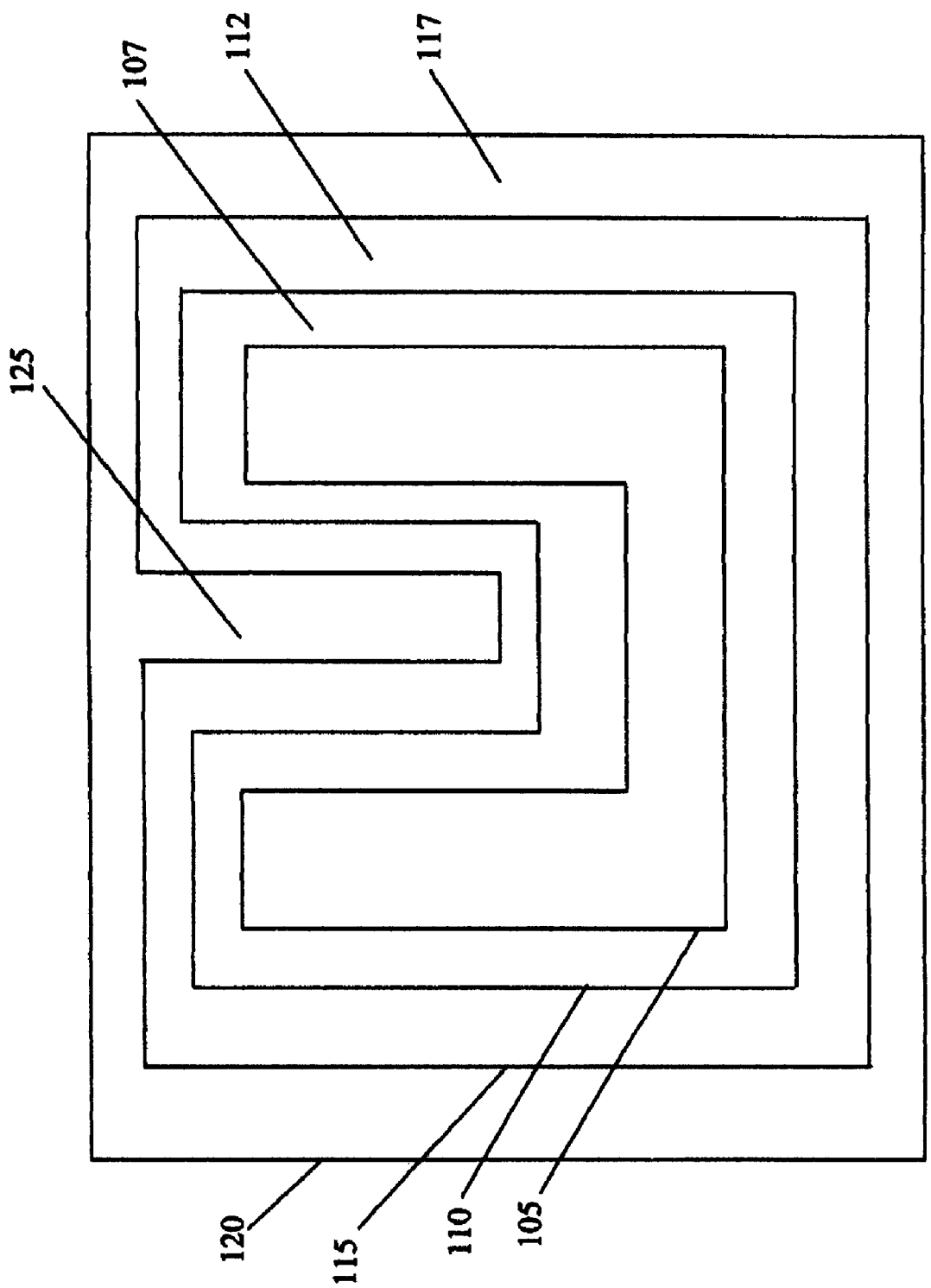
FIG. 2 illustrates varying the size of a resist in predetermined increments.

Referring to FIG. 2, a resist 105 is shown where the resist 105 is generally a "U" shaped resist. The resist 105 is simultaneously grown on all of its edges in incremental steps. Accordingly, a first stepped perimeter 110 surrounds the resist 105 defining a first area 107. A second stepped perimeter 115 surrounds the first stepped perimeter 110 and also defines a second area 112. A third stepped perimeter 120 surrounds the second stepped perimeter 115 and defines a third area 117.

It should be noted that the second stepped perimeter 115 and first stepped perimeter 110 both retain the general "U" shape of the resist 105; however, because the two arms of the "U" of the resist 105 have merged together in the third stepped perimeter 120, an area 125 between the arms of the "U" shaped resist 105, 125 is lost, and the third stepped perimeter 120 generally defines a square shape. Thus, scattering effects from the interior edges of the arms of the "U" are lost when the resist 105 is stepped above a certain size.

Figure 3:
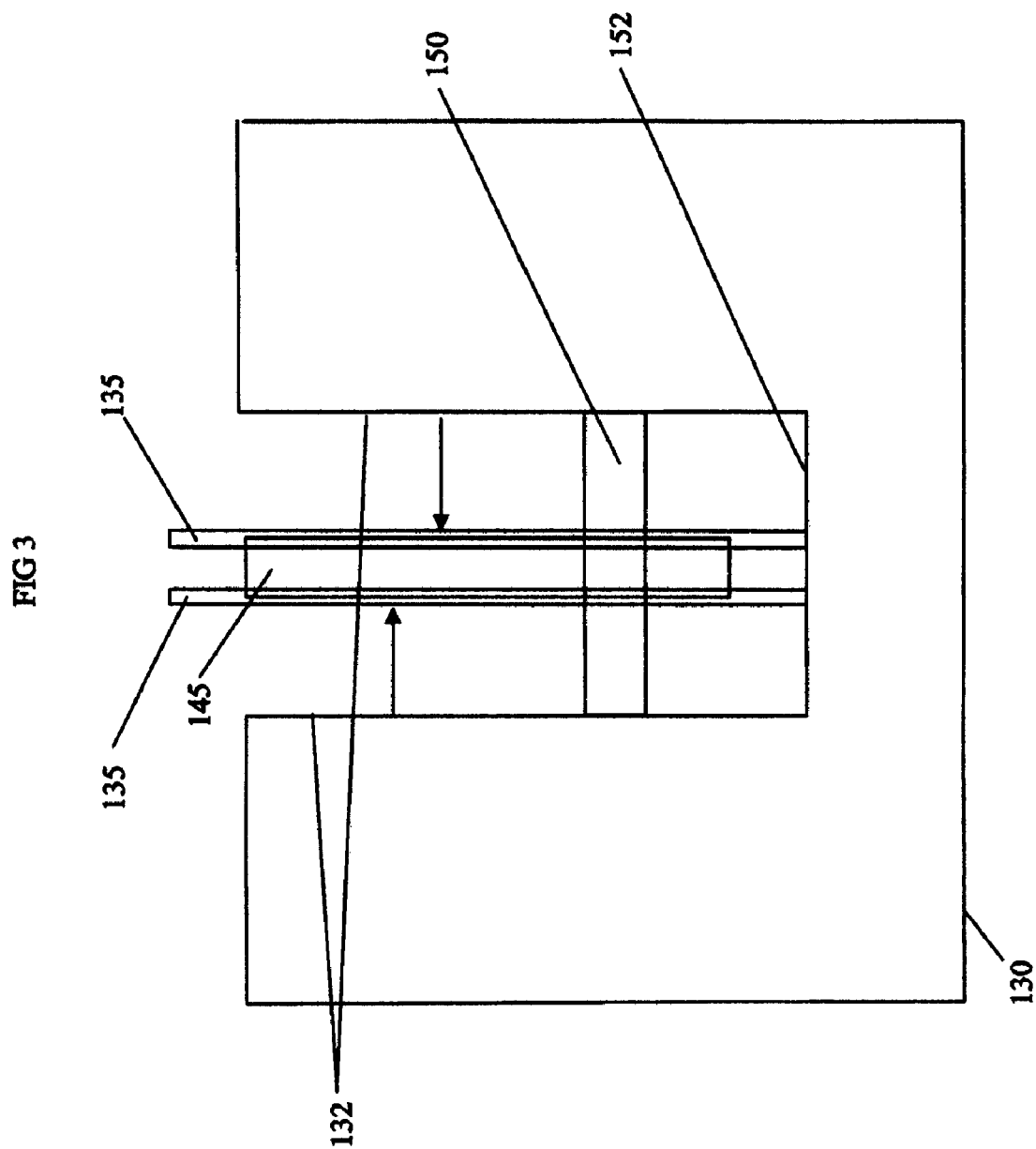
FIG. 3 illustrates individually varying the location of resist edges in increments in accordance with the invention.

Referring to FIG. 3, a resist 130 is shown where the resist 130 generally describes a "U" shape. Additionally, a gate 145 is located within the area between the two arms of the resist 130. Also shown on the arms of the "U" shaped resist 130 are interior edges 132, and the bottom of the "U" shaped resist 130 has a bottom edge 152. During the incrementing process, each of the edges 132 and 152 are individually incremented in a predetermined direction. Accordingly, the interior edges 132 of the resist 130 may be stepped towards one another and towards the gate 145. After a predetermined number of steps are executed, the stepped edges will form stepped edges 135 intercepting the gate 145, i.e.; the stepped edge 135 will overlap a portion of the gate 145. Additionally, the bottom edge 152 of the "U" shaped resist 130 will be stepped towards the gate 145 and end at a stepped edge 150.

Each stepped edge, including step edges 135 and 152 are made adjacent and substantially parallel to a previous edge. Accordingly, an edge can be stepped across a selected area where each edge will touch its previous stepped edge. Each edge can be of virtually any size, each step increment can be of virtually any size, and the number of steps can be of virtually any size. For example, step edges may be 0.2 microns in width and include ten steps which would step an edge of a resist across a distance of 2 microns. Also the step size and size of a stepped edge may be varied with each step.

Thus, as should now be understood, each edge of an n-well defined by a resist 130 is grown inward and/or outward independently of the other edges of the n-well. It can be seen that the gate 145 is actually receiving much higher scattering effects due to accounting for the overlapped edges than would be calculated by conventional methods. Accordingly, areas where the expanded n-well edge intersects both the gate and other expanded edge will be counted twice except where the third and only horizontal edge shape requires that the area be counted three times. As such, each expanded edge shape is intersected with the gate and the resultant area is summed up and applied to the other device as a parameter, which results in a higher and more accurate calculation for the effects of n-well scattering on individual FETs.

Figure 4:
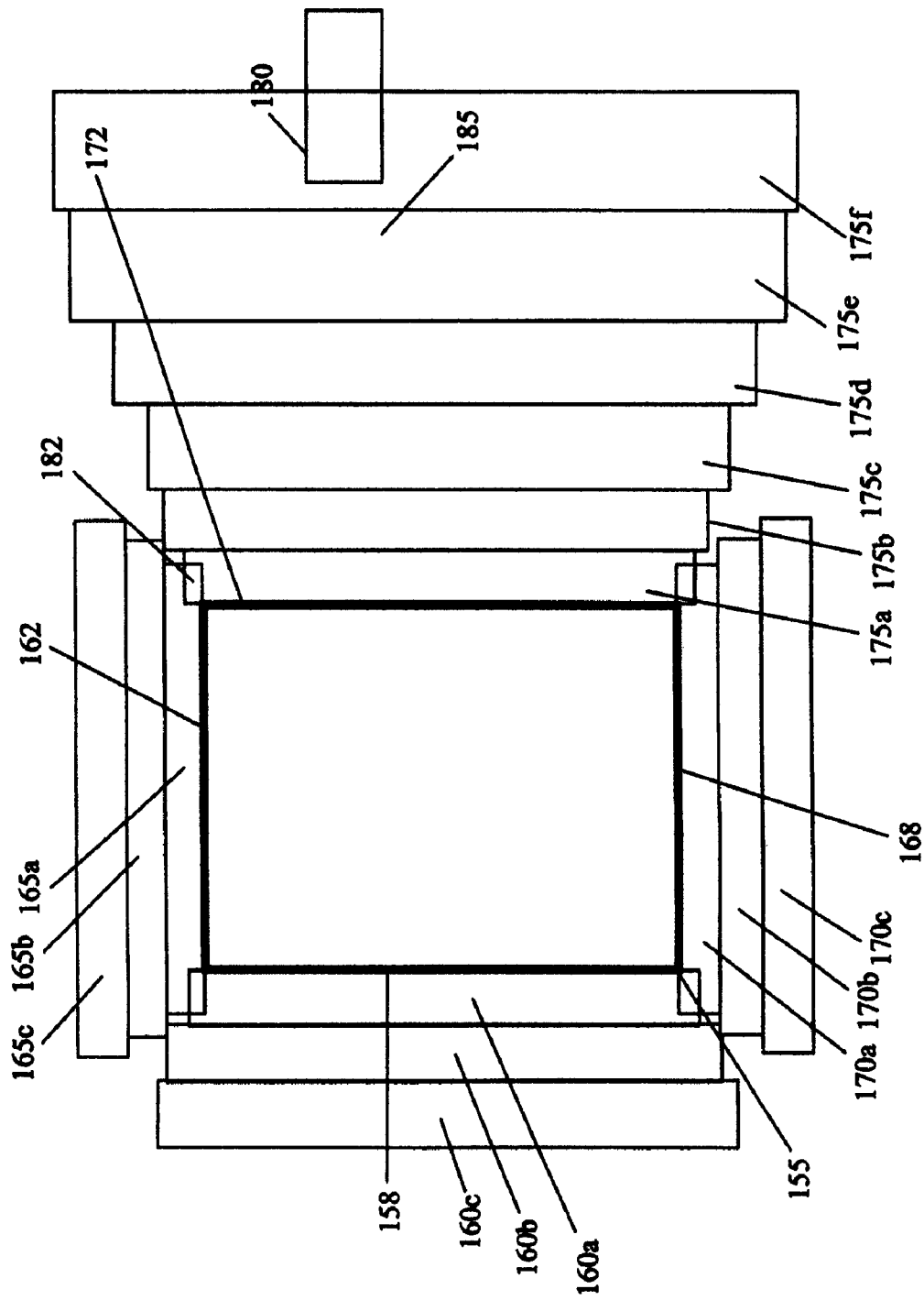
FIG. 4 illustrates individually varying the location of a resist edge in increments up to a gate in accordance with the invention.

Referring to FIG. 4, an opening in a resist 155 which generally defines a square opening is shown. Each edge of the opening in the resist 155 can be stepped outward or inward. Accordingly, a bottom edge 168 of the opening in the resist 155 may have rectangle steps 170a-c formed therefrom. A left side edge 158 of the opening in the resist 155 may have steps 160a-c formed therefrom. A top edge 162 of the resist opening in the 155 can have steps 165a-c formed therefrom. Also, a right edge 172 of the resist 170 may have steps 175a-f formed therefrom. As with all the stepped edges, each step 175a-f from the right edge 172 is made adjacent and substantially parallel to a previous step. Additionally, each stepped edge 175a-f from the right edge 172 is made longer in order to accommodate end effects of each particular edge step 175a-f.

The edge steps 175a-f from the right edge 172 are stepped along until a gate 180 is intersected forming an intersection area 185. As can be seen, because each edge 158, 162, 168 and 172, are stepped independently of one another, the ends of the step edges may overlap one another. For example, the edge of the first step 165a from the top edge 162 of the opening in the resist 155 overlaps with the first step 175a of the right edge 172 to form an edge overlap area 182. Additionally, because each stepped edge 162a and 175a is counted individually, the overlap area 182 may be counted twice when determining scattering effects.

As can be additionally seen by steps 175a-f, the width of a step may be increased or decreased as it steps away from the edge of the opening in the resist 155. Accordingly, steps 175a-f becomes thicker as the steps are stepped away from the right edge 172 of the resist 155. This same phenomenon may be used with any of the stepped features. In this example, the edges of 158, 162, 168, 172 of the resist 155 generally describe a square opening in the opening in the resist 155.

Figure 5:
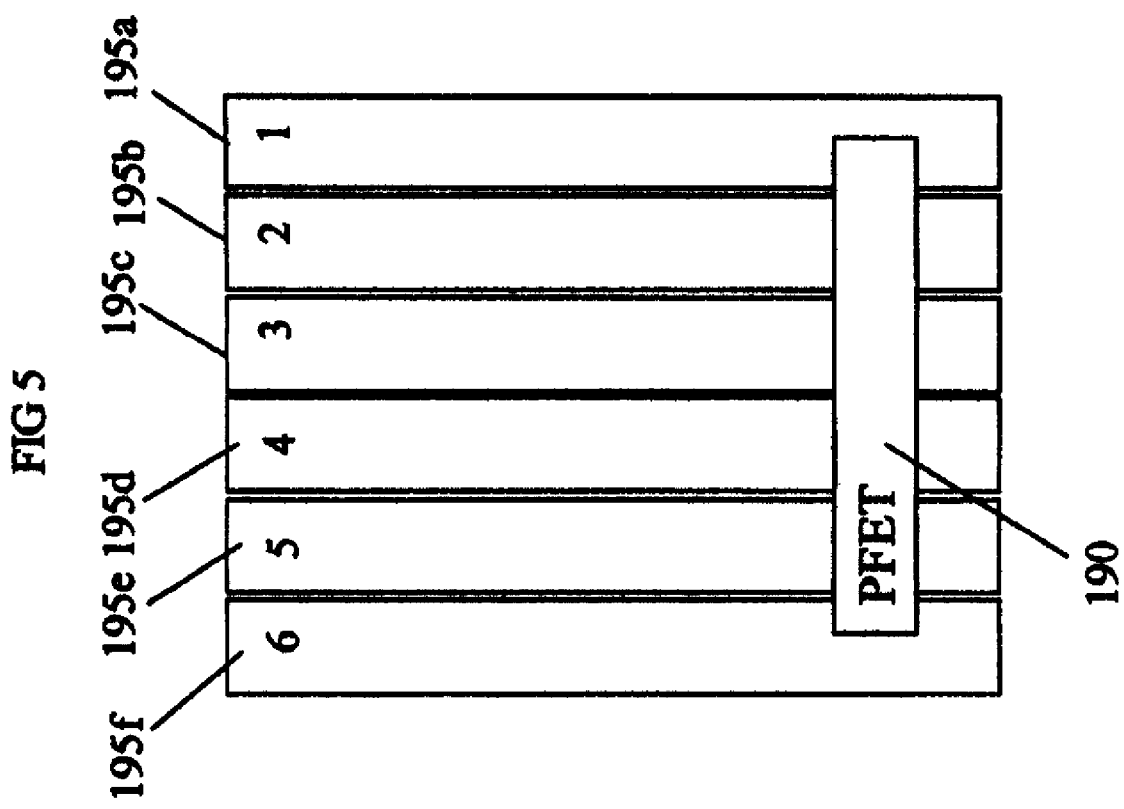
FIG. 5 illustrates individually varying the edge of a resist in predetermined increments over a gate in accordance with the invention.

Referring to FIG. 5, step edges 195a-f are shown where the step edges 195a-f step across a p-FET 190. Accordingly, a resist can produce step edges, where the step edges moves towards or across either an n-FET, a p-FET or other type of device located on a semiconductor layer.

Figure 6:
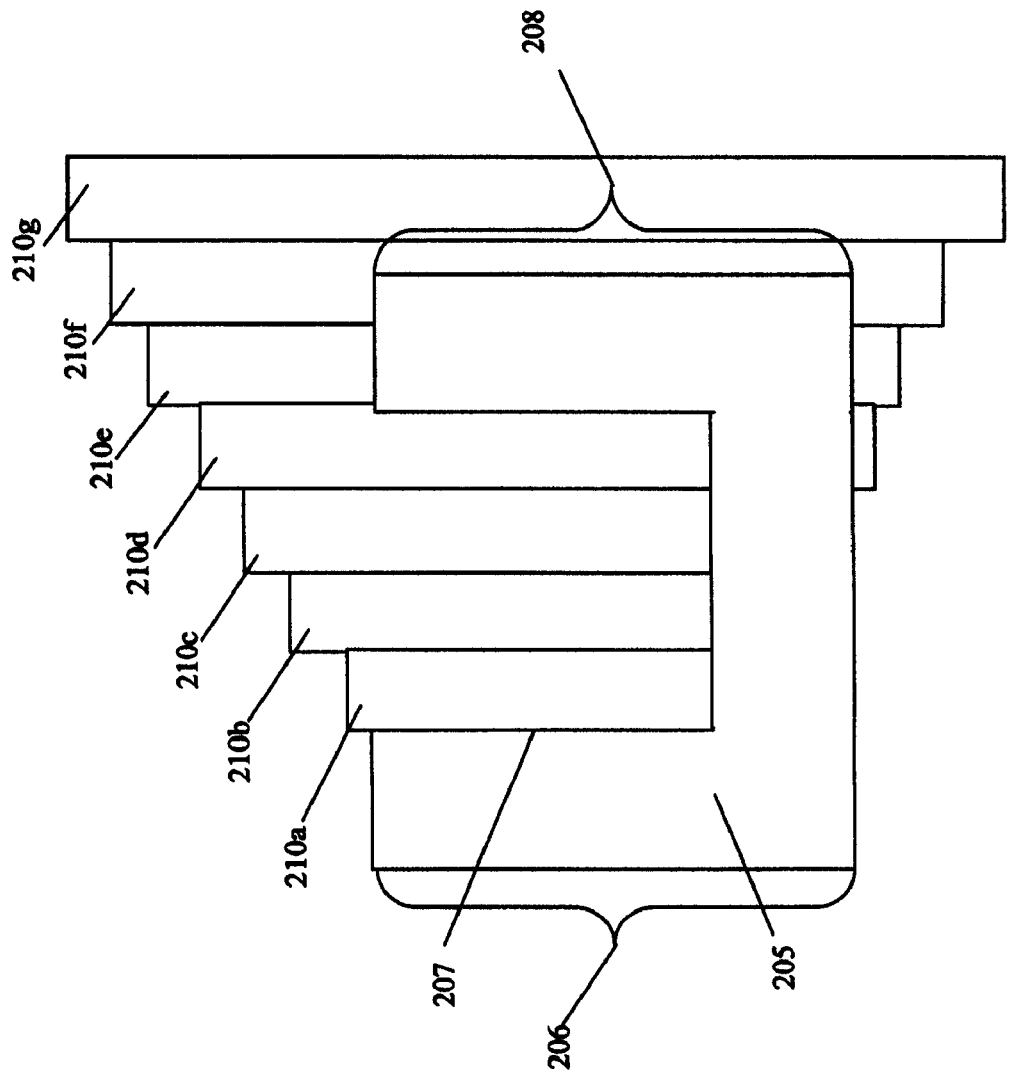
FIG. 6 illustrates individually varying the location of a single edge of a resist in accordance with the invention.

Referring to FIG. 6, an opening in a resist 205 generally describing a "U" shape having a left arm (i.e.; a first arm) 206 and a right arm (i.e.; a second arm) 208 is shown. An inside edge of the left arm 206 has a series of steps 210a-g stepping away from the left arm 206. Each of the steps 210a-g become slightly longer with each step. Additionally, the steps 210a-g may step away from the left arm 206 and cross over the right arm 208. Accordingly, steps 210a-g may cross a portion of the opening in the resist 205 opposite from the left arm 206 of the opening in the resist 205. Consequently, by individually controlling each edge of the opening in the resist 205, a single edge of an arm 206 can be stepped while other edges of the opening in the resist 205 are not altered.

Figure 7:
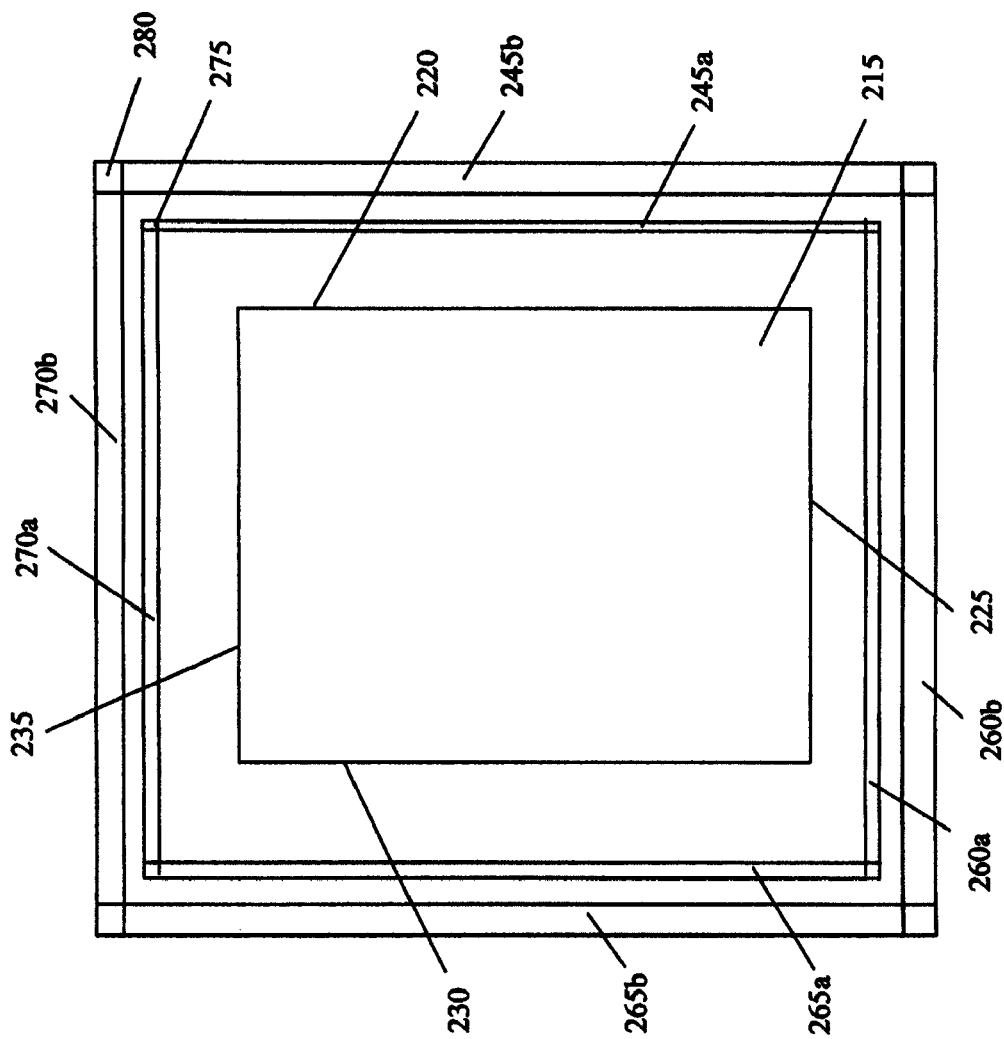
FIG. 7 illustrates individually varying the location of the edges of an n-well in accordance with the invention.

Referring to FIG. 7, an n-well 215 is shown. The n-well 215 can be formed by a doping process where an opening in a resist determines the location and shape of the n-well 215, and some dopants may be scattered from the edge of the resist into the n-well 215. The n-well 215 may be divided into its individual component edges 220, 225, 230 and 235, and each individual component edge 220, 225, 230 and 235, is stepped outward. It should be noted that not all of the stepped edges are shown in this figure, and accordingly, the stepped edges for each corresponding edge, 220, 225, 230, and 235 are not shown adjacent to one another. Accordingly, the right edges 220, 225, 230 and 235 each have stepped edges. For example, the edge 220 has multiple step edges, which correspond to step edges 245a and 245b.

As can be seen from FIG. 7, because each edge 220, 225, 230, 235 is individually stepped, adjacent stepped edges may overlap one another. For example, the first stepped edge 245a of the right edge 220 and the first stepped edge 270a of the top edge 235 may overlap one another in an overlap region 275. Additionally, the second stepped edge 245b of the right edge 220 and the second stepped edge 270b of the top edge 235 may overlap one another in overlap region 280. Accordingly, these overlap regions 275 and 280 would be counted twice, once for each calculation done with the corresponding edge, thus enhancing the accuracy of the scattering effect determination. Also shown is how each increment of a stepped edge can vary in length and/or thickness. Accordingly, the first stepped edge 245a and the second stepped edge 245b of the right edge 220 are of different thickness.

Figure 8:
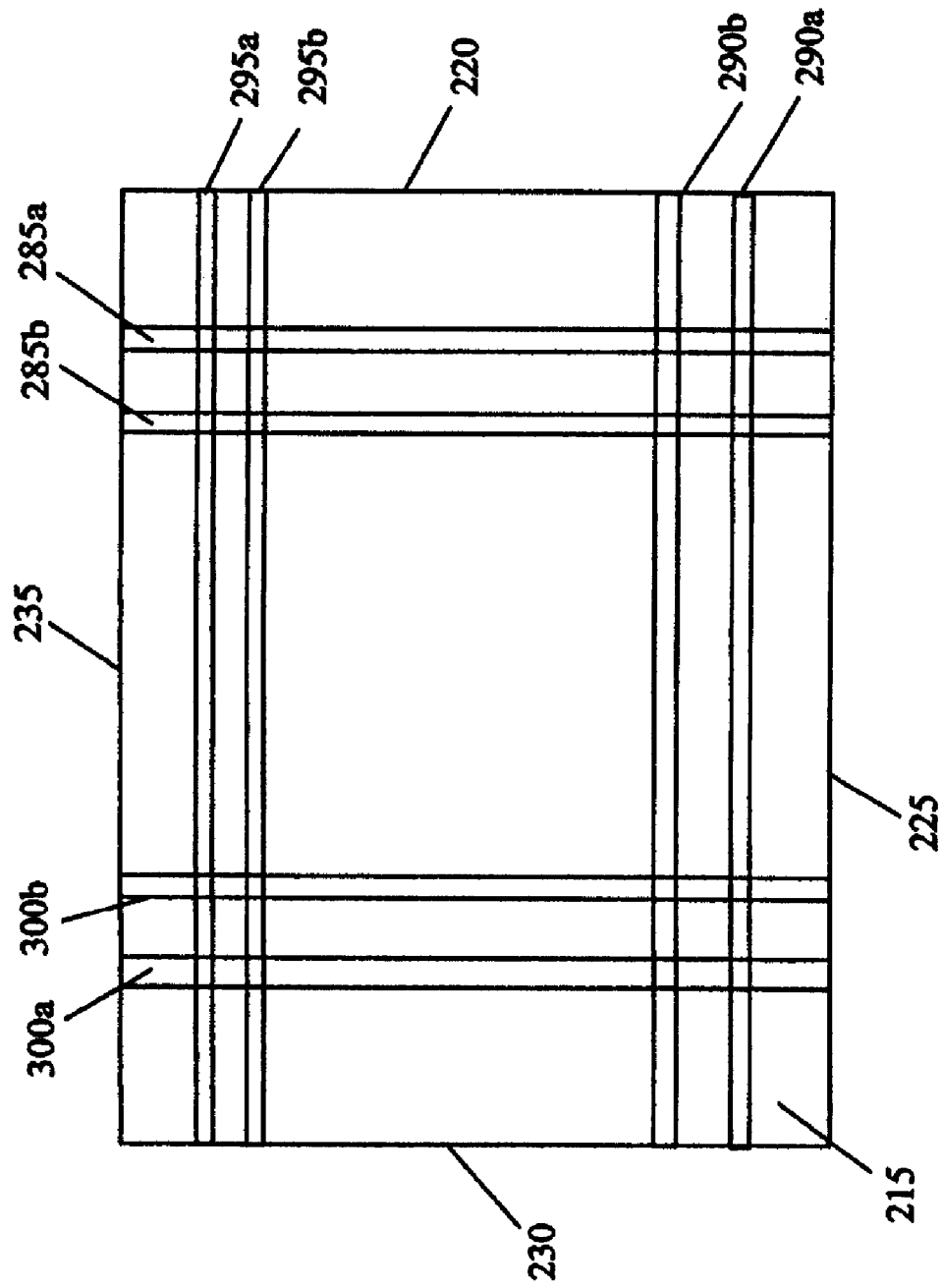
FIG. 8 illustrates individually varying the location of the edges of an n-well in accordance with the invention.

Referring to FIG. 8, the n-well 215 of FIG. 7 has edges 220, 225, 230 and 235. The n-well 215 is divided into its individual component edges, 220, 225, 230 and 235, and each individual component edge is stepped inward. Accordingly, edge 220 has a first stepped edge 285a and a second stepped edge 285b. The edge 225 has a first stepped edge 290a and a second stepped 290b. The edge 230 has a first stepped edge 300a and a second stepped edge 300b. The edge 235 has a first stepped edge 295a and a second stepped edge 295b. Accordingly, each edge may be stepped across the entire n-well 215 as well as beyond the n-well 215. It should also be noted that only two stepped edges are shown for each edge; however, there may be as many stepped edges as desired or required for a particular purpose.

While the invention has been described in terms of exemplary embodiments, those skilled in the art will recognize that the invention can be practiced with modifications and in the spirit and scope of the appended claims.

What is claimed is:

1. A method of calculating dopant scattering effects, comprising the steps of:
    forming a shape having at least one substantially straight edge on a surface of a scatter-doped region of a semiconductor;
    forming at least one first rectangle parallel and adjacent to the at least one substantially straight edge which is stepped along to intersect or overlap a component of the semiconductor;
    calculating results of dopant scattering effects from the at least one first rectangle on a prescribed portion of the surface; and
    linking the results to the prescribed portion of the surface to the component,
    wherein the steps are implemented in a manufacturing process of a semiconductor.

2. The method of claim 1, further comprising successively forming multiple rectangles where each rectangle is formed parallel and adjacent to a previous rectangle, and calculating the results of dopant scattering effects for each rectangle after its formation.

3. The method of claim 1, wherein the shape defines any one of at least one of a square, rectangle, triangle, parallelogram, trapezoid, "L", and a "U".

4. The method of claim 1, wherein forming the at least one first rectangle comprises forming a first rectangle for each substantially straight edge of the shape, where one first rectangle overlaps another first rectangle of a substantially straight edge.

5. The method of claim 2, wherein at least one rectangle of the successively formed multiple rectangles is longer than another rectangle of the successively formed multiple rectangles.

6. The method of claim 2, wherein a width of a rectangle of the successively formed multiple rectangles varies based on a position of the rectangle.

7. The method of claim 2, wherein each of the successively formed multiple rectangles comprises a different width, and the rectangles cover a region of the surface two microns wide.

8. A method of calculating scattering effects of an n-well, comprising the steps of:
    dividing a shape having at least one substantially straight edge into at least one component edge corresponding to the at least one substantially straight edge;
    forming a first rectangle from the at least one component edge;
    intersecting the first rectangle with at least one FET; and
    attaching a first intersected area value to the at least one FET,
    wherein the steps are implemented in a manufacturing process of a semiconductor by accurately determining the scattering effects.

9. The method of claim 8, further comprising:
    successively forming multiple rectangles where each rectangle is formed parallel and adjacent to a previous rectangle; and
    attaching a respective intersected area value for each rectangle, and intersected FET to the at least one FET.

10. The method of claim 8, further comprising forming a second rectangle parallel and adjacent to the first rectangle, wherein the second rectangle is larger than the first rectangle.

11. The method of claim 8, wherein a length of the first rectangle corresponds to the at least one component edge.

12. The method of claim 9, wherein the multiple rectangles each comprise a different width, and all of the multiple rectangles cover a region of the surface two microns wide.

13. The method of claim 8, wherein the shape defines any one of at least one of a square, rectangle, triangle, parallelogram, trapezoid, "L", and a "U".

14. The method of claim 8, further comprising forming at least another rectangle for each substantially straight edge of the shape, where the first rectangle overlaps the at least another rectangle of another substantially straight edge.

15. A method of calculating scattering effects of an n-well, comprising the steps of:
    stepping a straight edge of a shape across a surface towards at least one of an n-FET and a p-FET, wherein stepping the straight edge comprises forming a first rectangle and a series of successive rectangles, the first rectangle is formed adjacent and parallel to the straight edge and formed over the at least n-FET and pFET, wherein each successive rectangle is formed adjacent and parallel to a preceding rectangle and wherein the stepping is implemented in a manufacturing process of a semiconductor.

16. The method of claim 15, wherein a width of a rectangle of the successive rectangles corresponds to a position of the first rectangle.

17. The method of claim 15, wherein the shape defines any one of at least one of a square, rectangle, triangle, parallelogram, trapezoid, "L", and a "U".

18. The method of claim 15, wherein forming the first rectangle comprises forming a substantially straight edges and the first rectangle overlaps another rectangle of a successive rectangle.

19. The method of claim 15, wherein each of the successive rectangles comprises a different width, and all the rectangles cover a region two microns wide.

20. The method of claim 15, wherein the successive rectangles are formed adjacent to one another and a gate of a FET is intersected by at least one rectangle of the successive rectangles.

21. The method of claim 15, further comprising attaching a respective intersected area value for each rectangle of the first rectangle and the successive rectangles which intersects a gate of a FET.

22. The method of claim 15, further comprising forming at least another rectangle for each substantially straight edge of the shape, where the first rectangle overlaps the at least another first rectangle of another substantially straight edge.

* * * * *